United States Patent [19]

Janisiewicz

[11] Patent Number: 4,485,548
[45] Date of Patent: Dec. 4, 1984

[54] CUT AND CLINCH HEAD FOR TRIMMING, FORMING AND DETECTING LEAD PRESENCE AND ABSENCE OF DIP COMPONENTS

[75] Inventor: Stanley Janisiewicz, Endwell, N.Y.

[73] Assignee: Universal Instruments Corporation, Binghamton, N.Y.

[21] Appl. No.: 357,075

[22] Filed: Mar. 11, 1982

[51] Int. Cl.³ .............................................. H05K 13/04
[52] U.S. Cl. .................................... 29/566.3; 29/593; 29/705; 29/741; 29/838
[58] Field of Search ................ 29/705, 715, 741, 739, 29/564.7, 33 M, 884, 837, 838, 566.1, 566.3, 564.8, 593; 140/105; 324/73 PC, 158 P, 158 F

[56] References Cited

U.S. PATENT DOCUMENTS

| | | | |
|---|---|---|---|
| 3,646,659 | 3/1972 | Ragard | 29/715 |
| 3,724,055 | 4/1973 | Holmes et al. | 29/739 |
| 4,151,637 | 5/1979 | Zemek et al. | 29/566.1 |
| 4,165,557 | 8/1979 | Taguchi et al. | 29/566.3 |
| 4,284,314 | 8/1981 | Lesyk | 29/884 |
| 4,292,727 | 10/1981 | Maxner | 29/71 S |
| 4,309,808 | 1/1982 | Dean et al. | 29/71 S |

Primary Examiner—Z. R. Bilinsky
Assistant Examiner—Thomas M. Kline
Attorney, Agent, or Firm—Fidelman, Wolffe & Waldron

[57] ABSTRACT

An apparatus is provided for trimming and forming the leads of multi-lead electronic components such as dual in-line package (DIP) components, wherein component leads extending through the holes of a circuit board are trimmed and formed on the underside thereof, with the presence or absence of each lead being detected after trimming and during forming thereof.

4 Claims, 7 Drawing Figures

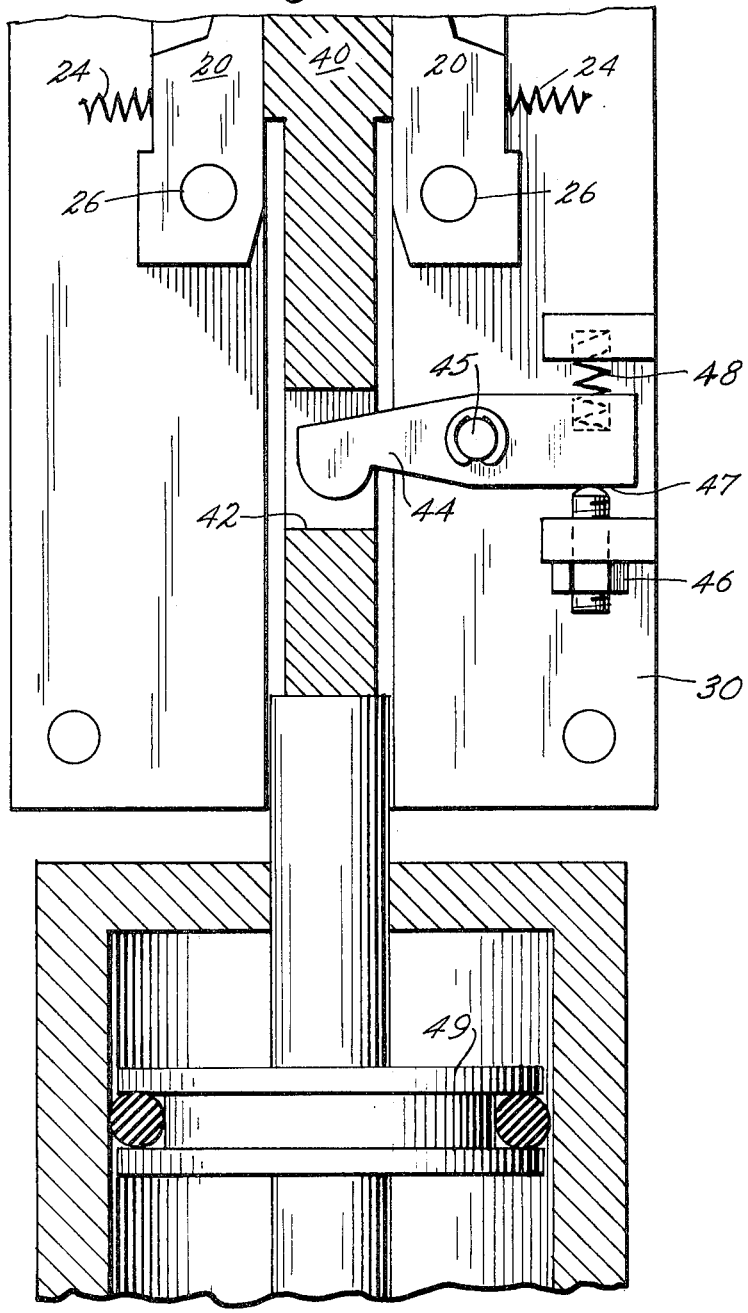

CUT AND CLINCH HEAD FOR TRIMMING, FORMING AND DETECTING LEAD PRESENCE AND ABSENCE OF DIP COMPONENTS

CROSS-REFERENCES TO PRIOR ART

U.S. Pat. No. 4,286,379—APPARATUS FOR DETECTING LEADS—Kawa, et al., issued Sep. 1, 1981.

U.S. Pat. No. 4,218,817—COMPONENT MOUNTING APPARATUS—Takano, issued Aug. 26, 1980.

Japanese Patent Laid-Open No. 74989/1981—CUTTER FOR APPARATUSES FOR CUTTING LEAD TERMINALS OF ELECTRONIC COMPONENTS—Laid-Open Date: June 20, 1981.

BRIEF BACKGROUND AND SUMMARY OF THE INVENTION

The present invention relates to an apparatus for trimming and forming the leads of multi-lead electronic components such as dual in-line package (DIP) IC components and for detecting the proper insertion of the leads into a circuit board.

DIP components comprise parallel rows of leads projecting from each side of the component, with anywhere from two to twenty individual leads in each row. In high volume, mechanized population of circuit boards with electronic components, there exists a need for trimming the excess portions of the leads which extend through the circuit board and bending or forming (clinching) the remaining portions of the leads to the underside of the circuit board prior to soldering, such as by flow soldering. If a lead has been misinserted, continued population and processing of the circuit board would be a waste of valuable time and effort. Accordingly, the instant invention provides means for detecting a misinserted lead, during the forming thereof, such that a programmed controller for the overall operation may receive information regarding the misinsertion and halt or change the processing of the circuit board according to the particular program used.

Of the above-referenced prior art, only U.S. Pat. No. 4,286,379 provides means for detecting whether or not all of the leads of DIP-type components have been inserted properly into a circuit board. This reference teaches the detection of properly inserted leads during the forming or clinching of the leads to the underside of the circuit board. Plural pivotal forming or clinching levers, one for each lead, are provided with apertures through which light-emitting elements may communicate with light-receiving elements when the levers have been properly displaced by engagement with properly inserted component leads. When a lead is not properly inserted, i.e., does not extend below the circuit board, this lever displacement does not occur and the respective lever will block light transmission to provide an indication of an improperly mounted component. The complexity of the forming and detecting head of this prior art prevents, or at least limits, any provision for lead trimming, as exemplified by the lack of any reference thereto in the disclosure. Furthermore, the spring means which biases each lever into proper position, prior to lead engagement, presents an engineering design problem in that the leaf material from which it is made must be very light, when used with soft leads, to assure a positive displacement or deflection of the levers by the soft leads; thus, without constant cleaning of the tooling assembly, any contamination buildup therein can affect these springs as well as the photosensors.

The above-referenced U.S. Pat. No. 4,218,817 discloses a pair of pivotal trimming and/or forming arms having stress detecting elements attached thereto for detection of a properly inserted lead upon engagement of an arm therewith. This reference does not address the problem of dealing with multi-lead components such as DIPs. Although not disclosed, adaptation of the teaching of this prior art reference to such multi-lead components would necessitate the provision of a pivotal arm for each lead of the component, thus increasing the complexity of such a tooling assembly.

The above-referenced Japanese Patent Laid-Open No. 74989/1981 also does not contemplate or disclose a solution to the problem of dealing with multi-lead components, and the teaching therein presents the same adaptation complexity in solving this problem as that of U.S. Pat. No. 4,218,817.

It is an object of the present invention to provide an apparatus, which is relatively uncomplicated in structure and reliable in function, for detecting the presence or absence of each lead of a multi-lead component such as a DIP.

It is a further object of the invention to provide such an apparatus which is easily maintained and replaced.

It is a further object of the invention to provide an apparatus which, although particularly useful in the trimming, forming and detecting of multi-lead components such as DIPs, is also useable with radial lead or axial lead components which have been inserted into a circuit board or the like.

It is a further object of the invention to provide a lead trimming, forming and detecting means in which the angle of forming or clinching of the remaining portion of the lead to the underside of the circuit board is adjustable.

In accomplishing these objectives, as well as other objectives which will become apparent from the following disclosure, the instant invention provides a head assembly having a pair of anvils fixed relative to the head assembly, one anvil for each row of leads, and a pair of cutting and forming arms moveable relative to the head assembly such that each cutting and forming arm cooperates with a respective anvil by engaging and driving all of the leads of one row into engagement with the anvil and, during passing of the cutting and forming blade across the anvil, trimming excess portions of the leads and forming or clinching the remaining portions of the leads to the underside of the circuit board. During the forming portion of the operation, the cutting and forming arms drive the remaining portions of each properly inserted lead into engagement with a respective electrical contact finger to provide a ground and complete an individual circuit for each contact finger. Ground for the circuit corresponding to any particular lead will not be completed upon absence of that lead remaining portion, since the cutting and forming blade is limited in movement to prevent direct engagement with the contact fingers corresponding to that row.

BRIEF DESCRIPTION OF THE DRAWINGS

FIG. 7 is a partial view of the means for adjusting movement of the trimming and forming arm to adjust the angle of forming or clinching of a lead to the underside of a circuit board.

For a fuller understanding of the nature and objects of the invention, reference should be had to the following detailed description taken in conjunction with the accompanying drawings.

DETAILED DESCRIPTION OF THE DRAWINGS

Figure 6:
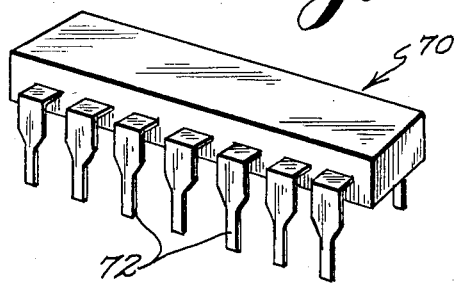
FIG. 6 is an isometric view of a DIP component.

FIG. 6 illustrates a DIP component having two rows of in-line leads projecting from the sides thereof. It is for this type of electronic component that the instant invention is adapted, in particular.

Figure 1:
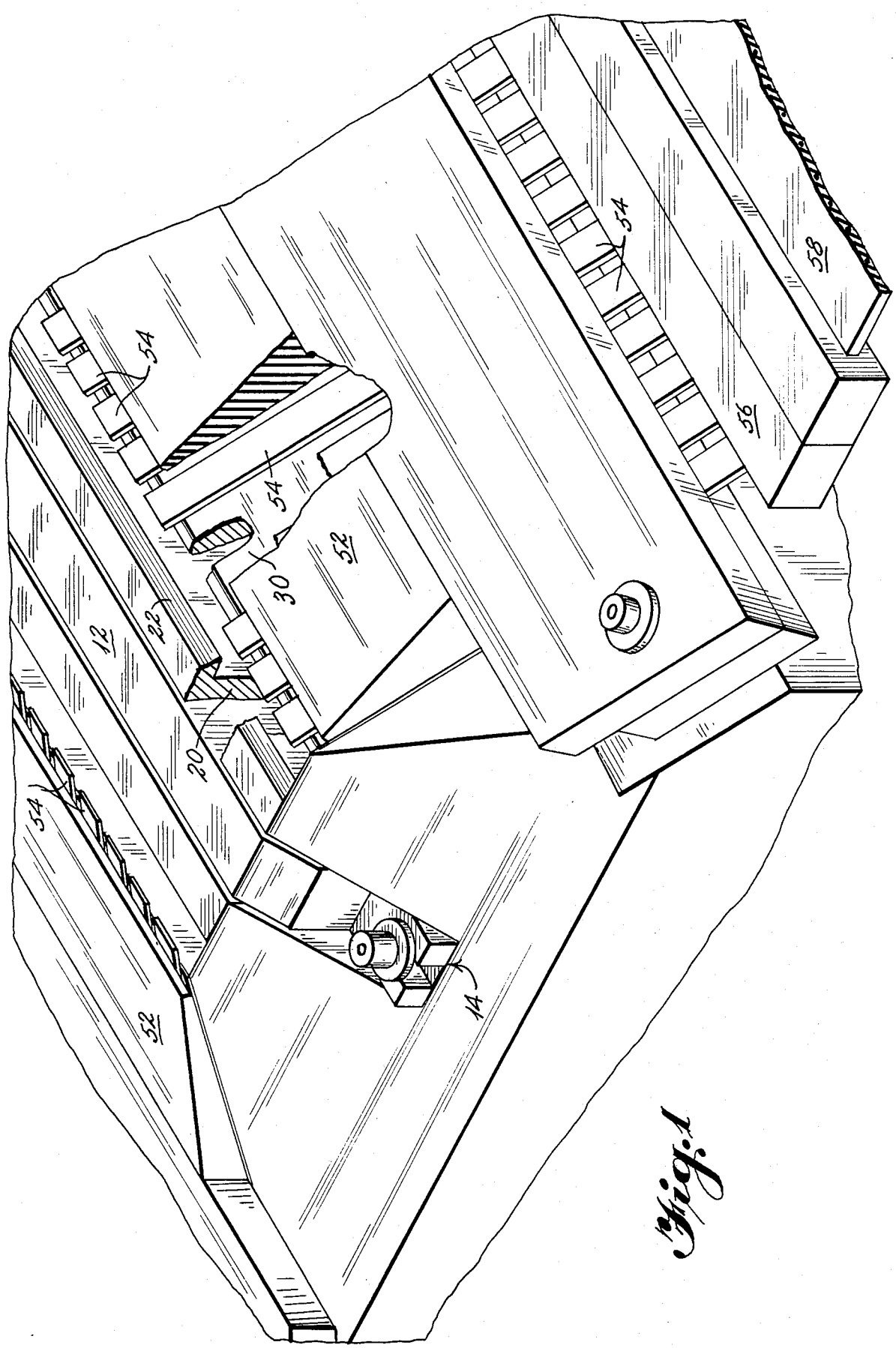
FIG. 1 is a partial isometric view, with parts broken away, of the trimming, forming and detecting head assembly.
Figure 2:
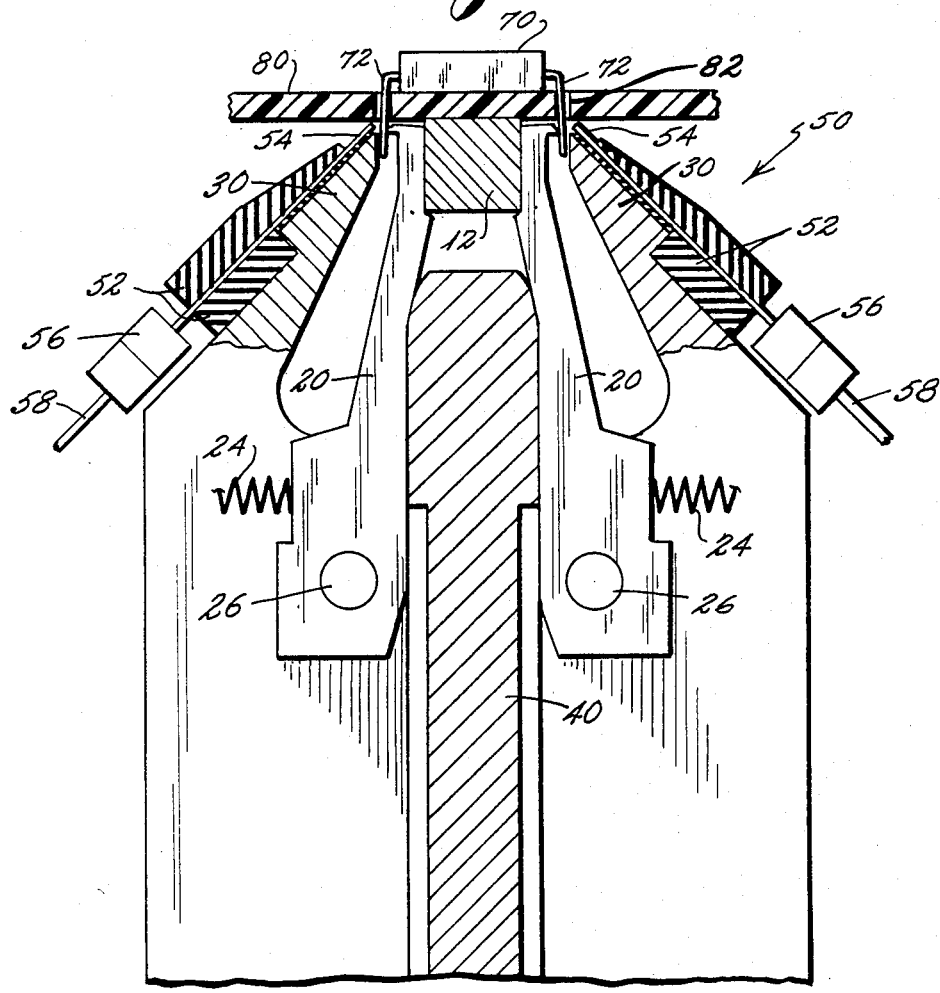
FIG. 2 is a partial side elevation of the head assembly in a raised position below the underside of a circuit board, with portions thereof in section and as viewed when looking down the length of a DIP component.
Figure 3:
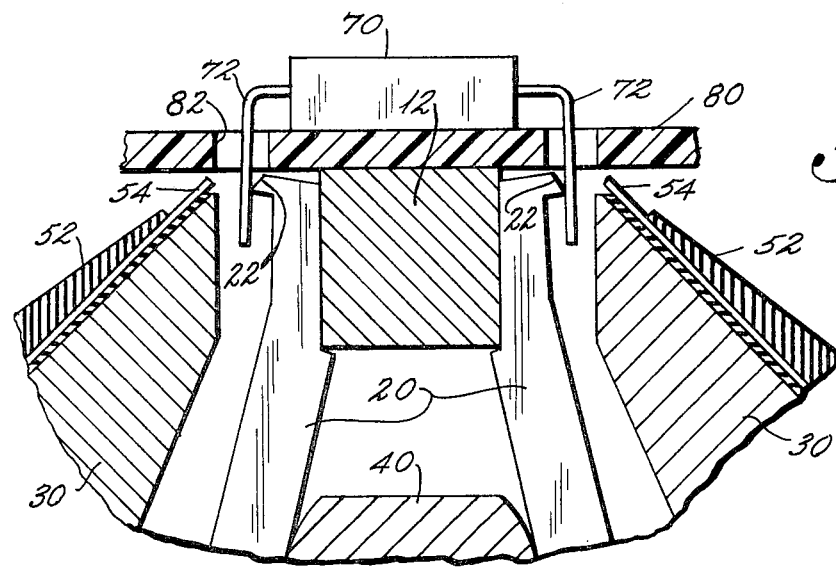
FIGS. 3 and 4 are enlarged views depicting lead receiving, trimming, forming and detecting by the novel head assembly.

In FIG. 3, a DIP 70 has been mounted onto circuit board 80 (as by an insertion head which is not shown) such that leads 72 extend through holes 82 of circuit board 80, prior to trimming and forming thereof for temporary attachment of the component before soldering of the leads to the respective tracks of the circuit board 80. The cut and clinch head assembly is particularly adapted for DIP-type components 70 and comprises a pair of spaced anvils 30 which are fixed relative to the head assembly and a pair of rotatable cutting and forming arms 20, each of which cooperates with a respective anvil 30. Since one side of the device operates on one row of leads 72 and is a mirror image of the other side of the device, only one side of the device will be described in detail hereafter. Referring to the right side of FIG. 2, arm 20 pivots about a pivot rod 26, which connects arm 20 to anvil 30, with arm 20 being biased to an open position away from anvil 30 by compression spring 24. To trim and form lead 72, vertically reciprocatable actuator cam 40 is moved upwardly for camming of arm 20 such that the cutting blade portion 22 (FIGS. 1 and 5) moves across the top of anvil 30. Moving actuator rod 40 back downwardly allows compression spring 24 to return arm 20 to the open or lead receiving position, with stop member 12 determining the extent of this opened or receiving position. During set-up of the overall apparatus, stop member 12 also provides a convenient means of gauging how close the top of cutter arm 20 may approach the underside of circuit board 80. In this regard, various spacers (not shown) may be provided at connection point 14 (FIG. 1) of stop member 12 to the head assembly.

The amount of upward movement of actuator cam 40 determines the extent of rotation of arm 20 and is adjustable, as may be seen in FIG. 7. In this regard, actuator cam 40 is attached to and driven by fluid piston 49 to provide vertical reciprocation thereof. Cam 40 has a slot or opening 42 for receiving one end of horizontal arm 44 which is pivotal at 45. The function of arm 44 is to limit the upward displacement of actuator cam 40 by piston 49 such that the amount of pivoting of trimming and forming arms 20 is controllable. In order to limit upward movement of cam 40, a set screw adjustment 46 is provided to limit the amount of pivoting of horizontal arm 44 by engagement at 47. Spring 48 is provided in order that arm 44 remains in engagement with the adjustable set screw stop 46. Adjustment of set screw 46 upward (as viewed in FIG. 7) will lower the end of horizontal arm 44 which extends into slot 42 and thus limit the upward movement of actuator cam 40 and provide a looser clinch of the leads to the underside of the circuit board. Adjustable lowering of set screw 46 allows higher movement of actuator cam 44 so that the leads are more tightly clinched to the underside of the circuit board. By adjusting the amount of rotation that arm 20 may pivot outwardly, the angle between the underside of circuit board 80 and the bent or formed remaining portion 74 is presettable. This allows the adjustment of the degree or strength of clinch of the DIP 70 to the underside of the circuit board. A decrease of clinching angle is advantageous to prevent solder bridging problems between clinched leads when flow soldering a circuit board having a high density population of components thereon; a looser angle is sometimes preferred to facilitate ease of removal of a defective component from a circuit board.

Mounted on anvil 30 is a contact assembly 50 comprising a plurality of separate contact fingers 54 which are insulated from each other and from anvil 30 by electrical insulation material 52. These contacts extend out of the insulation 52 near the shearing surface of anvil 30 and are spaced from each other such that each contact finger 54 is engageable with a component lead during forming. The opposite ends of contact fingers 54 are connected to a commonly available quick-disconnect electrical coupling 56 to facilitate their circuit connection to a programmed controller (not shown) by flat multi-conductor cable 58. Contact fingers 54 are sufficiently flexible that varied angles of clinching of the leads to the underside of circuit board 80 are accommodated, while being sufficiently rigid to provide structural strength and good electrical contact when a lead is driven into engagement therewith.

Figure 4:
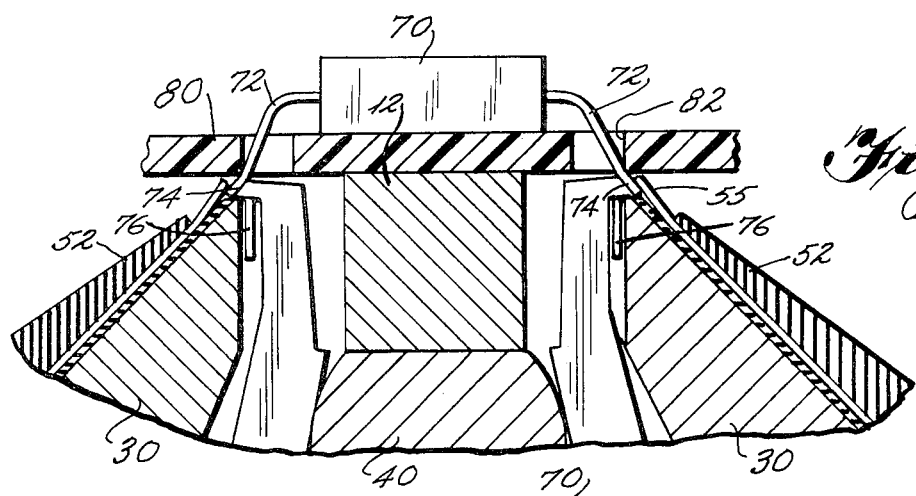

Referring to FIG. 4, the leads of the component have been cut by a shearing action between cutting and forming arms 20 and anvil 30 such that excess lead portions 76 are trimmed and remaining portions 74 are driven into engagement with contact fingers 54 to flex these fingers (as at 55 of FIG. 4). Arm 20 is angled, as at 22 of FIGS. 1 and 5, for the purpose of forming a lead after it has been sheared to the proper length. Contact fingers 54 are arranged such that they are not engaged by remaining portion 74 of lead 72 until after the shearing operation and during the forming operation. Accordingly, an individual circuit from the program controller, not shown, is provided to each individual contact finger 54 via multi-conductor cable 58 and quick-disconnect electrical coupling 56 so that, during the forming operation, remaining portion 74 of a properly inserted lead 72 will complete an electrical path to ground, through arm 20, for each respective lead.

Figure 5:
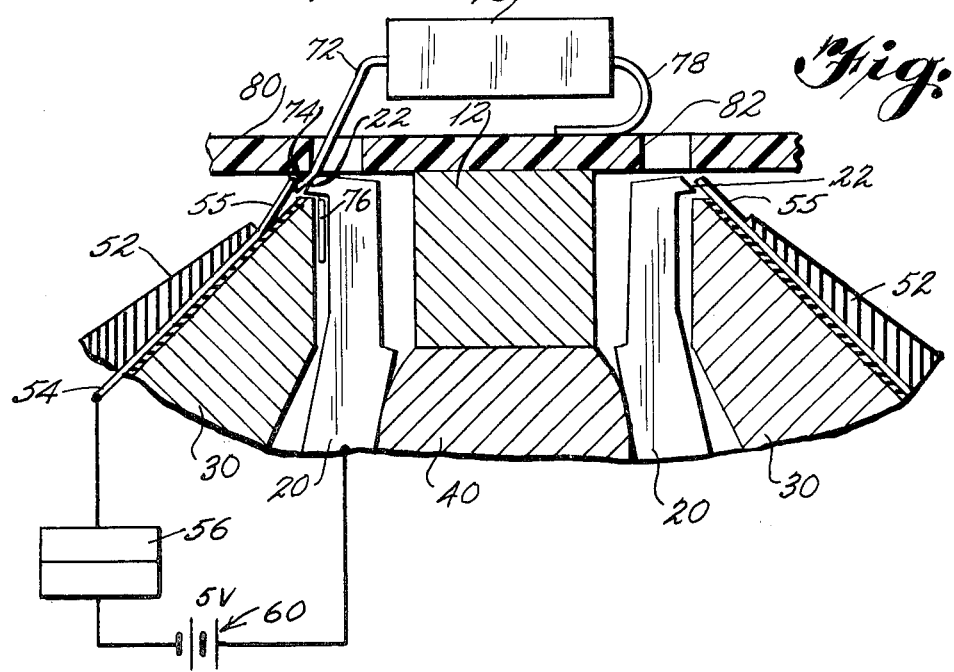
FIG. 5 is a view similar to that of FIGS. 3 and 4 in which an improperly inserted lead is depicted along with the schematic circuit for detection of a properly inserted lead.

When a lead is deformed as at 78 in FIG. 5, or otherwise, an improper insertion occurs so that ground cannot be completed to the particular contact finger and associated circuit for that lead. According to well-known programming principles, this absence of a completed circuit is also detectable.

In general, the leads of DIP components are relatively flat and have an average thickness of flatness of 0.010–0.012 inches with their relative width, as viewed in FIG. 6, generally less than or equal to 0.020 inches.

The angular orientation between arm 20 and anvil 30 provides a stop means for limiting the amount that arm 20 may swing outwardly, with a minimum spacing between the cutting and forming surface 22 and contact 54 of approximately 0.010 inches.

As in known prior art devices, the excess, trimmed lead portions 76 are removed from the head assembly by a negative air pressure. Additionally, the instant invention provides a positive air pressure (not shown) across the surfaces of the contact fingers in order to prevent any possible buildup of metal particles or other extraneous debris which could possibly give an incorrect reading.

It will thus be seen that the objects set forth above, among those made apparent from the preceding description, are efficiently obtained and, since certain changes may be made in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. An apparatus for trimming and forming in-line rows of leads of an electronic component which extend through holes in and below the underside of a circuit board such that an excess portion of each lead is trimmed off and a remaining portion of each lead is formed by bending so as to clinch said component to said circuit board, said apparatus comprising:
   a head assembly comprising spaced, fixed anvils and movable trimming and forming arms, each of said trimming and forming arms cooperating with a respective anvil to trim and form the leads of one of said rows of leads which extend below said circuit board;
   means for biasing each of said trimming and forming arms away from said respective anvil so as to provide a gap into which a row of leads is receivable;
   means for moving said trimming and forming arms across said anvils upon command; and means for detecting individually the presence and absence of each of said leads extending below said circuit board, said detecting means comprising an in-line row of separate flexible contact fingers attached to each of said anvils respectively, means for insulating electrically each of said fingers one from the other and from said anvil to which said fingers are attached and each of said contact fingers being engageable with said remaining portion of a respective lead after said trimming and during said bending, such that said trimming and forming arms push each said remaining portion into contact with a respective finger during said bending so as to complete a separate electrical circuit through each particular remaining portion to a respective finger upon the presence of said particular remaining portion and not to complete said circuit upon the absence of said particular remaining portion.

2. An apparatus as in claim 1, and further comprising:
   an electrical insulative contact assembly attached to each of said anvils and comprising means for holding said fingers in a spaced relation and quick-disconnect means for removeably attaching said fingers to a programmable means for controlling said apparatus according to the presence and absence of each said remaining portion.

3. An apparatus as in claim 1, wherein said means for moving said trimming and forming arms across said anvils comprises:
   means for adjusting the amount of movement of said trimming and forming arms such that an angle of bending is adjustable.

4. An apparatus as in claim 1, wherein said means for moving said trimming and forming arms comprises:
   means for pivoting said trimming and forming arms relative to said fixed anvils.

* * * * *